United States Patent
Nadi et al.

(10) Patent No.: US 6,459,394 B1
(45) Date of Patent: Oct. 1, 2002

(54) MULTI-BANK FLASH ADC ARRAY WITH UNINTERRUPTED OPERATION DURING OFFSET CALIBRATION AND AUTO-ZERO

(75) Inventors: Itani R. Nadi; Rex Baird, both of Austin, TX (US); Matthew M. Kostelnik, Arvada, CO (US); Mokry Wesley, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 09/863,205

(22) Filed: May 22, 2001

(51) Int. Cl.[7] ............................................. H03M 1/10
(52) U.S. Cl. ........................................ 341/120; 341/155
(58) Field of Search ................................ 341/120, 118, 341/155, 156

(56) References Cited

U.S. PATENT DOCUMENTS

| | | | |
|---|---|---|---|
| 3,597,761 A | * 8/1971 | Fraschilla | 341/155 |
| 4,794,374 A | 12/1988 | Koike | 341/120 |
| 5,099,240 A | * 3/1992 | Nakatani et al. | 341/156 |
| 5,450,085 A | * 9/1995 | Stewart et al. | 341/159 |
| 5,500,644 A | 3/1996 | Denjean et al. | 341/120 |
| 5,990,814 A | 11/1999 | Croman et al. | 341/118 |
| 6,084,538 A | 7/2000 | Kostelnik et al. | 341/120 |
| 6,198,420 B1 | * 3/2001 | Ryan et al. | 341/155 |
| 6,232,907 B1 | * 5/2001 | Nagaraj et al. | 341/159 |

* cited by examiner

Primary Examiner—Peguy JeanPierre
(74) Attorney, Agent, or Firm—Dan A. Shifrin, Esq.

(57) ABSTRACT

A system and method is disclosed for calibrating comparators of an ADC while the ADC continues to operate in an uninterrupted fashion. Groups (banks) of interleaved comparators may be calibrated at random or psuedo-random times while the ADC is performing conversions without the addition of extra "proxy" or replacement comparators. More particularly, at periodic intervals the comparators of one bank may be disconnected from the standard ADC circuitry for calibration or auto-zeroing while the comparators in the remaining bank(s) are left in the data conversion path. In order to prevent a significant degradation in the conversion quality, logic downstream of the comparators provides the necessary adjustments to accommodate for the removal of the comparators and outputs a word of the desired bit length. The multi-bank ADC is particularly advantageous for use with optical data storage systems.

25 Claims, 8 Drawing Sheets

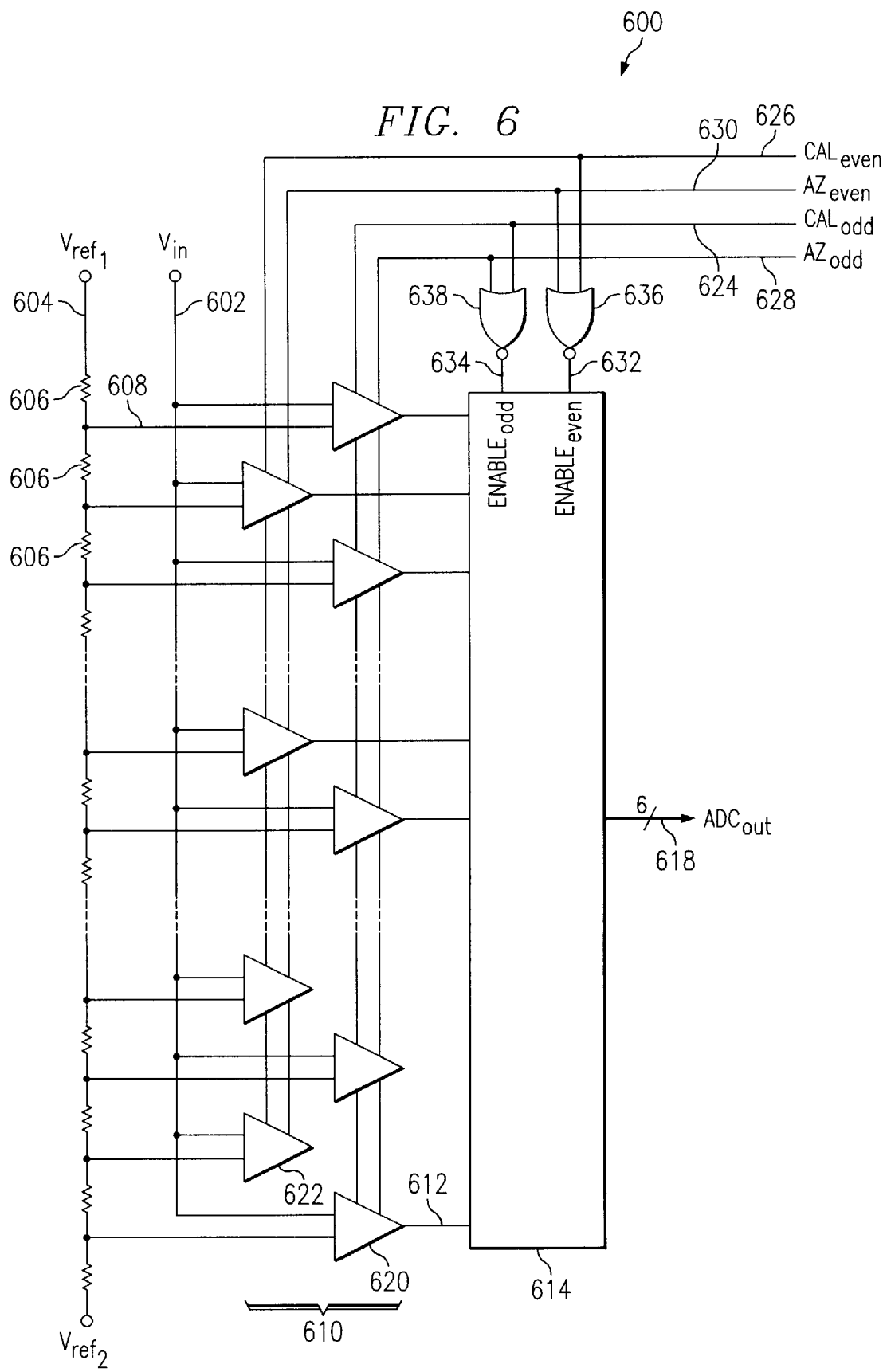

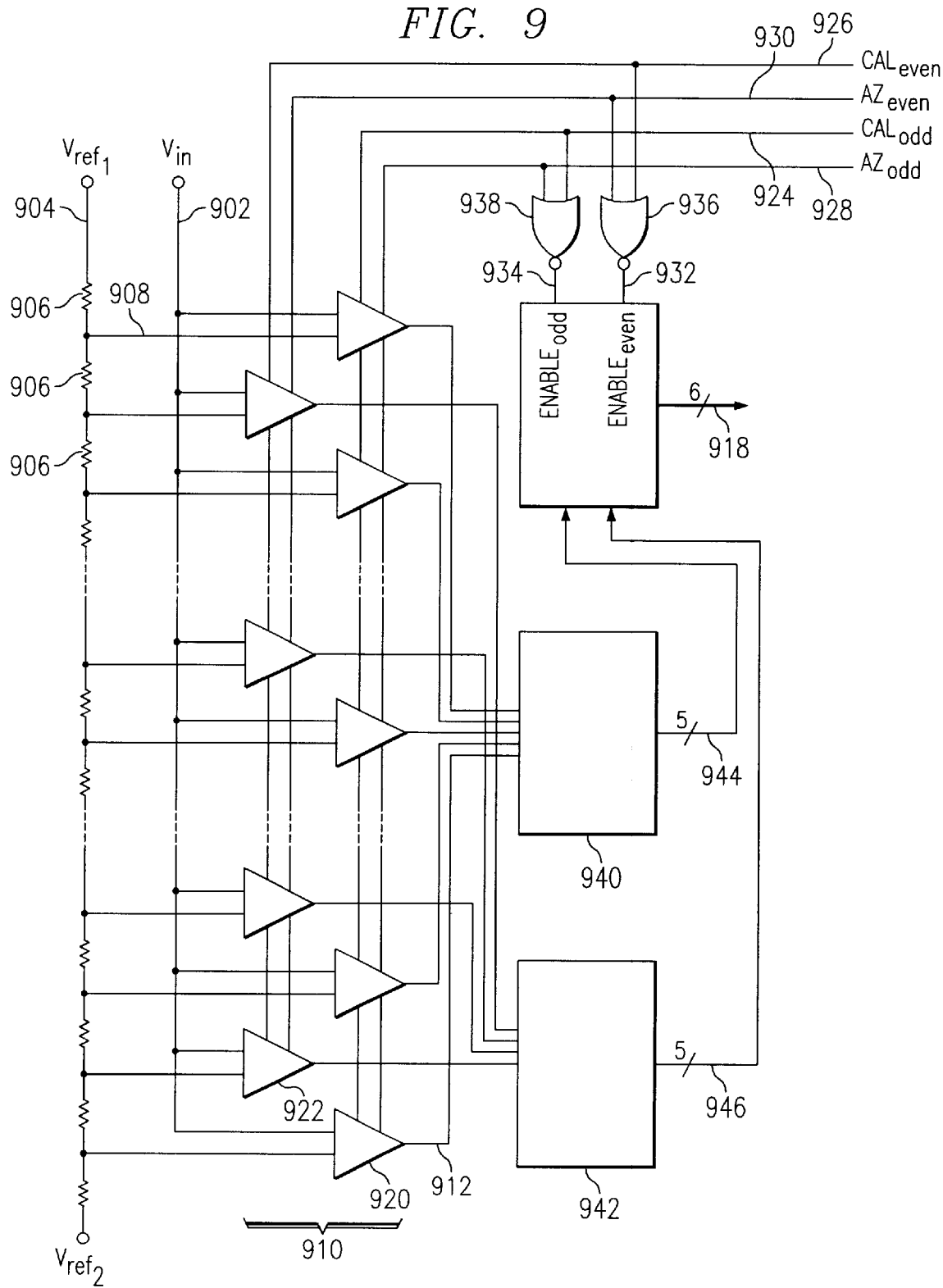

MULTI-BANK FLASH ADC ARRAY WITH UNINTERRUPTED OPERATION DURING OFFSET CALIBRATION AND AUTO-ZERO

CROSS-REFERENCE TO RELATED APPLICATIONS AND PATENTS

This application is related to co-pending U.S. Pat. No. 6,084,538, issued Jul. 4, 2000, and to U.S. Pat. No. 5,990,814, issued Nov. 23, 1999, both of which are commonly assigned to the assignee of the present application and both of which are incorporated herein by reference.

BACKGROUND OF THE INVENTION

1. Field of the Invention

The present invention relates to the offset calibration and auto-zeroing, and more particularly to offset calibration and auto-zeroing in flash analog to digital converters utilized in data transmission systems such as, for example, data communications channels and optical disc data storage systems using data channel circuits.

2. Description of Related Art

In many data detection circuits an electrical signal-is received from a data storage media, such as a CD-ROM, DVD, or other optical disk, magnetic hard disk, magnetic tape etc. In the case of optical disks, the electrical signal is generated from light that is reflected off an optical disk and converted to electrical pulses. The electrical pulses may then be transmitted to a data detection circuit for further signal processing to recover the data in a useable form. Data detection circuits may also be combined with circuitry for write operations. For example, circuitry for both read and write operations may be combined read/write channel circuits utilized with magnetic hard disks. In contrast, some optical disks are utilized in read only systems and thus the data detection circuit need not be combined with write circuitry. In general, both read only and read/write data detection circuits may also include servo circuitry.

Decoding the pulses into a digital sequence can be performed by a simple peak detector in an analog read channel or, as in more recent designs, by using a discrete time sequence detector in a sampled amplitude read channel. Discrete time sequence detectors are preferred over simple analog pulse detectors because they compensate for intersymbol interferences (ISI) and, therefore, can recover pulses recorded at high densities. As a result, discrete time sequence detectors increase the capacity and reliability of the storage system.

There are several well known discrete time sequence detection methods for use in a sampled amplitude read/write channel circuit including discrete time pulse detection (DPD), partial response (PR) with Viterbi detection, partial response maximum likelihood (PRML) sequence detection, decision-feedback equalization (DFE), enhanced decision-feedback equalization (EDFE), and fixed-delay tree-search with decision-feedback (FDTS/DF). When discrete methods are utilized for sampled amplitude read channel systems, an analog to digital converter (ADC) is typically utilized to convert the high frequency data which is contained on disk.

One type of ADC which may be utilized to convert high frequency disk data is a flash ADC. Such an ADC may contain multiple comparators for conversion of the analog data to digital data. A flash ADC may be designed in a number of manners. For example, an exemplary six bit flash analog to digital converter 100 is shown in FIG. 1. The ADC 100 includes an analog input 102 and a reference voltage input 104. The reference voltage is divided into $2^n$ separate voltages through a series of resistors 106 which form a resistor voltage divider. Output taps are provided from the resistor voltage divider to provide reference voltage inputs 108 to a series of $2^n-1$ comparators 110. The output of an ADC having $2^n$ reference voltages and $2^n-1$ comparators will have n bits. In one common ADC, illustrated in FIG. 1 in which n equals 6, sixty-four separate voltages are provided through sixty-four resistors 106 (each voltage varying by $\frac{1}{64}$ of the reference voltage 104 from the adjacent resistor) to inputs to the sixty-three comparators 110. The analog input 102 which is to be converted to a digital value is provided through another input to each of the comparators 110. Each comparator 110 receives control signals as shown by a control bus line 112. The control signal may include a clock signal operating at the system read operation clock speed (for example typically between 50 MHz and 1 GHz) and other control signals. The output of each comparator 110 is a binary state (high or low) which indicates whether the analog input 102 is greater than or less than the particular reference voltage 108 that is input to the comparator 110. The outputs 112 of the comparators 110, forming a thermometer code, are provided to digital encoding logic 114. By observing where the outputs of the comparators 110 change from one digital state to the other, the encoder 114 determines between which two reference voltages the analog input lies and provides a 6-bit digital representation of a voltage that represents, for example, the lower or higher reference voltage or a midpoint voltage. The 6-bit representation may then be provided, through clocked D flip-flops 116, on an output line as the ADC output 118. The digital encoding logic 114 may also include bubble suppression logic. It will be appreciated that n can be an integer other than 6. However, 6-bit ADCs are commonly employed in optical storage devices, such as that which may incorporate the ADC 100 of FIG. 1, and n=6 will be used to illustrate the ADCs herein.

In order to accurately convert the high frequency analog data, it is desirable that the comparators exhibit very little electrical variation from ideal operation even in the presence of "offsets". Many sources exist for offsets including mismatch between two devices (for example transistors, resistors, capacitors, etc.) which, though intended to be identical, vary to one degree or another due to limitations of fabrication processes.

One approach to compensate for such offsets is to utilize a DC auto-zero operation. FIG. 2 shows an example of a typical comparator configuration in a flash ADC 200. The ADC circuit 200 contains a gm stage 202 capacitively coupled to an analog input and reference levels through input switches. The ADC circuit 200 is shown differentially with two inputs and two reference voltages plus two outputs. During normal operation, the gm stage 202, the switches $SW_1$ and $SW_2$, and the two input capacitors $C_1$ and $C_2$ act as an integrator, integrating the input signal minus the reference for a fixed amount of time. The output of the integrator is transmitted to a latch stage 204 to be converted to a digital signal when a latch clock is applied. The digital signal will be one if the positive output is higher than the negative output and a zero if the negative output is higher than the positive output. Also included is a calibration circuit 208 to remove offsets and achieve higher performance with noise, clock feedthrough, offsets, and other circuit nonidealities. Auto-zero puts an initial voltage across the input capacitors $C_1$ and $C_2$ at regular intervals to set the appropriate reference across the input and to remove offsets in the gm stage 202. Auto-zero should repeated in order to reacquire the reference once the capacitance has leaked enough of its previous charge.

The ADC usually operates in a "normal mode". Periodically (about every 475 µs), it enters an auto-zero ("AZ") mode lasting about 50 ns. It also enters a calibration mode lasting about 1 clock periods following each AZ operation. FIGS. 3A–3C show exemplary timing signals for all three modes of operation. In FIG. 3A, representing the normal operation, signals SIG and REF, being complements of each other, are high and low, respectively; the input is sent to the comparator. AZ and CAL are both low and the signal INT and LATCH are clocked. In this configuration, the input minus the reference is integrated while INT is high; then LATCH goes high to latch the output to a digital state. FIG. 3B illustrates the timing of an AZ sequence. INT and LATCH have the same timing as shown in FIG. 3A; however, REF is brought high for several system clock cycles while SIG simultaneously low. These signals cause the input to switch to the reference signal which is tied to the resistor ladder reference. After REF is brought high, AZ is pulled high and held high for about 50 ns, then AZ goes low before the REF signal goes low to store the reference level on the input capacitor which is later used when comparing the input to the reference voltage. CAL is held low, during this mode. Finally, FIG. 3C illustrates the timing of a calibration sequence. In this mode, the timing for INT and LATCH remains the same as in FIGS. 3A and 3B. REF is held high for several system clock periods during which SIG is low. Simultaneously, AZ is held low while CAL is pulled high. The reference signal REF remains applied to the input. However, when CAL is held high, the output is examined to determine whether a positive or negative offset is required. When this CAL loop settles, there should be close to an equal number of ones and zeros from the comparator.

Understandably, it is desirable to auto-zero and calibrate the comparators of a flash ADC in such a manner so as not to impact the information that the ADC is converting. In magnetic data storage systems, such as magnetic hard disks, auto-zero and calibration operations may occur when the data channel is not in use. For example, magnetic media is generally written in concentric circles divided into sectors on a disk. Servo information is time multiplexed with user data allowing time periods to take the user data channel or the servo channel off line to perform an auto-zero or calibration operation. In data communications channels and optical storage systems (such as CD and DVD systems, for example), however, the data is generally stored in a continuous spiral on an optical disc without a sector break, both user data and servo data frequency being mutliplexed within the continuous data stream. Thus, in optical systems the data channel may be in continuous use for long periods of time without a break. In such cases, the ADC generally can not be disabled for auto-zero and calibration operations without disrupting the data stream. In order to provide for periodic calibrations of the ADC comparators, extra (or proxy or replacement) comparators may be provided via a multiplexing scheme such that if n comparators are to be utilized for the data conversion, the ADC will include at least n comparators. Thus, when one comparator is being calibrated, another comparator may be multiplexed into the ADC conversion path so that n comparators are still utilized. However, such multiplexing schemes undesirably require additional circuit complexity and disrupt the comparator array and resistor string.

In another proposed method (U.S. Pat. No. 6,084,538), individual comparators are calibrated at random or psuedo-random times while the ADC continues to perform conversions without the addition of extra "proxy" comparators. At periodic intervals a psuedo-random one of the comparators is disconnected or decoupled from the standard ADC circuitry for calibration. In order to prevent a significant degradation in the conversion quality, digital logic downstream of the comparators provides the necessary adjustments to accommodate the removal of one of the comparators from the data conversion path. This continuous data conversion is provided without interruption for calibration purposes.

SUMMARY OF THE INVENTION

A system and method are disclosed for calibrating and auto-zeroing comparators of an analog to digital converter. The $2^n-1$ comparators of an n-bit flash ADC are divided into two banks of $2^{n-1}$ and $2^{n-1}-1$ comparators, respectively, the comparators of the first bank being interleaved. with the comparators of the second bank. Control lines separately remove the first and second banks from the data conversion path for periodic calibration and auto-zeroing of the converters of the bank which has been removed. In a first embodiment, when both banks are in the data conversion path (that is, no converters are being calibrated or auto-zeroed), the outputs from both banks, each in the form of $2^{n-1}$ or $2^{n-1}-1$ bit thermometer code, are processed by an encoder into the n-bit ADC output. When either bank is removed from the data conversion path to be calibrated or auto-zeroed, the encoder converts the $2^{n-1}-1$ or $2^{n-1}1$ bit thermometer code from the other bank into the n-bit ADC output.

In a second embodiment, the $2^{n-1}$ bit thermometer code output from the first bank is coupled to a first encoder and the $2^{n-1}-1$ bit thermometer code output from the second bank is coupled to a second encoder. The output of each encoder, n–1 bit representations of the respective inputs, are coupled to combinatory logic. When both banks are in the data conversion path, the two n–1 bit words output from the two encoders are combined by the logic into the n-bit ADC output. When either bank is removed from the data conversion path, the combinatory logic converts the n–1 bit word from the other bank into the n-bit ADC output. The result, therefore, is comparable to the outputs from two 5-bit ADCs with a 0.5 bit offset.

BRIEF DESCRIPTION OF THE DRAWINGS

It is to be noted that the appended drawings illustrate only particular embodiments of the invention and are not, therefore, to be considered limiting of its scope, for the invention may admit to other effective embodiments.

FIG. 6 is a block diagram of one embodiment of a flash ADC of the present invention.

FIG. 9 is a block diagram of another embodiment of the flash ADC of the present invention.

Figure 10:
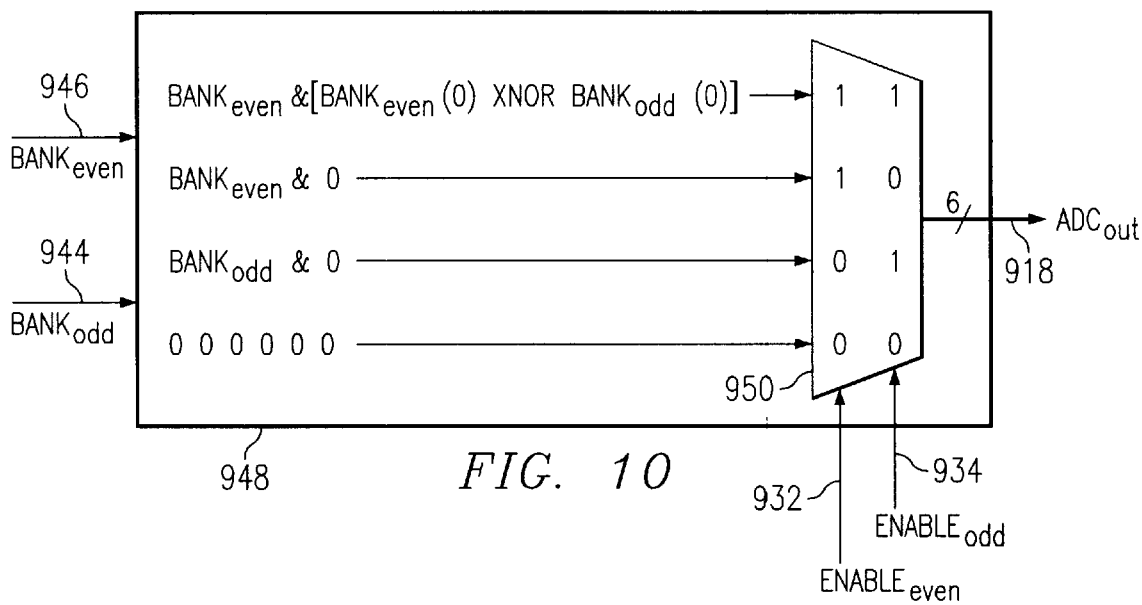

FIG. 10 is an embodiment of combinatory logic which may be used to generate the ADC output from the two words produced by the encoders of FIG. 9.

Figure 11:
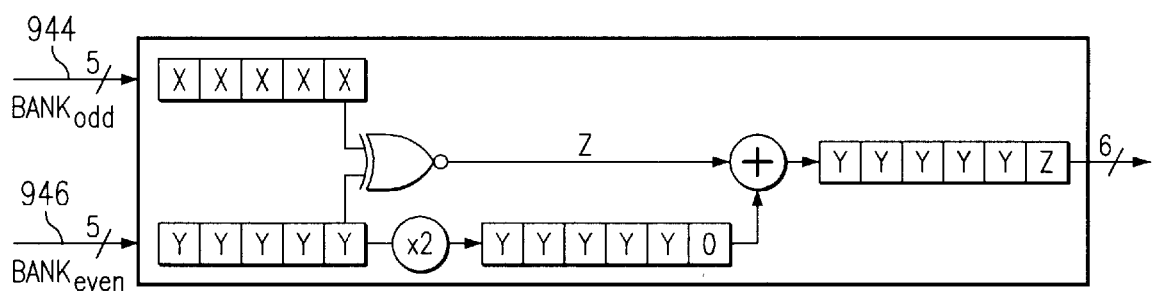

FIG. 11 is a block diagram of illustrating one method of an append operation.

Figure 12A:
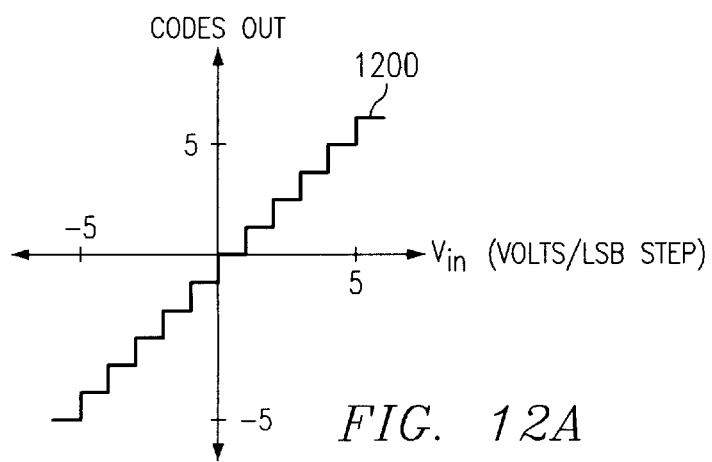
Figure 12B:
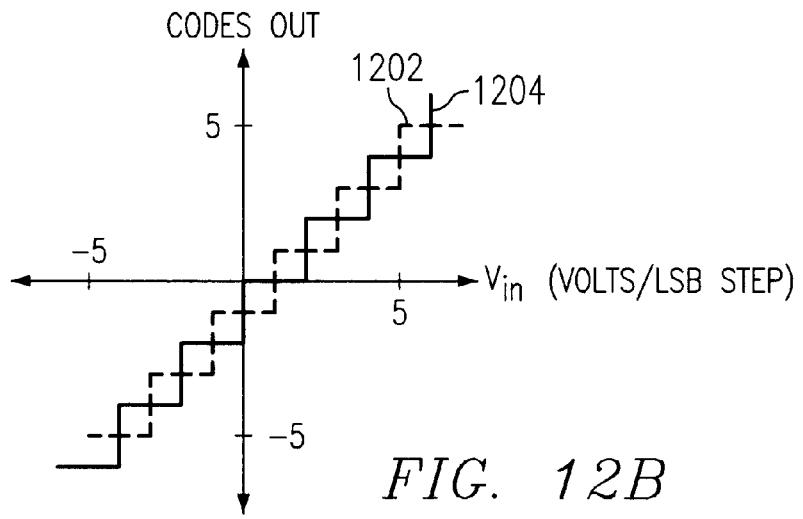

FIGS. 12A and 12B are plots of the transfer functions of one embodiment of the present invention when both banks of comparators are enabled and when each of the two banks are separately disabled.

Figure 13:
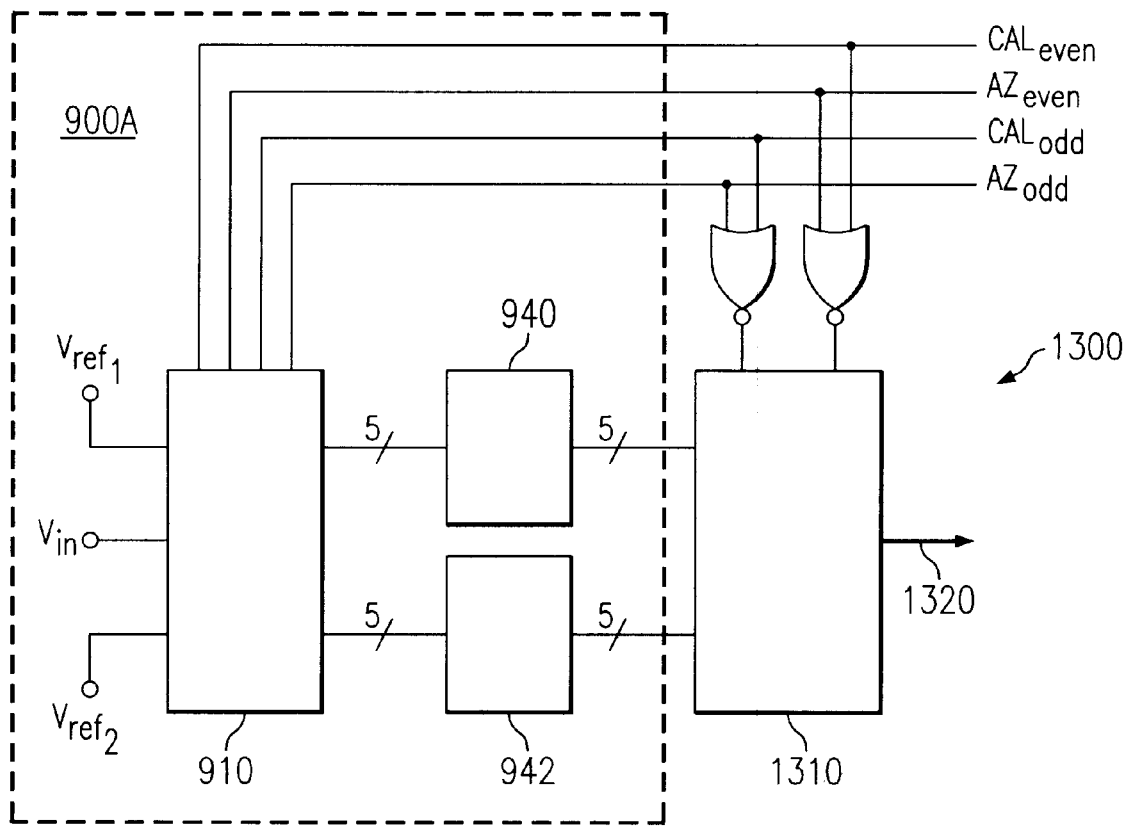

FIG. 13 is a block diagram of another embodiment of an ADC of the present invention.

DETAILED DESCRIPTION OF THE INVENTION

Figure 4:
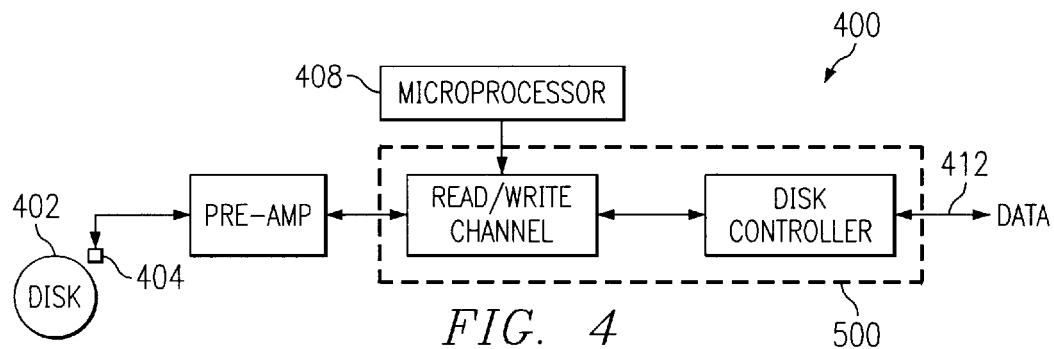
FIG. 4 is a block diagram of an optical disk data storage system in which the present invention may be incorporated.

FIG. 4 illustrates a data storage system 400 in which the present invention may be utilized (it will be appreciated that the invention may also be implemented in a data transmission system; the description herein of the invention in a data storage system is exemplary and not intended to be limiting). The data storage system 400 includes a disk 402 and a read head 404. In one embodiment, the disk 402 may be an optical disc such as a CD-ROM or a DVD disc and the read head 404 may be an optical pickup which utilizes a photodiode array to convert optical signals to analog electrical signals. Coupled to the read head 404 is a data detection circuit 500 which may include read circuitry, servo circuitry, and other circuitry. In the case of an optical storage system, the data detection circuit 500 includes a DVD or CD-ROM DSP (digital signal processor) and decoder circuit compatible with industry interface standards such as the standard IDE/ATA interface and more specifically the ATAPI (AT Attachment Packet Interface) interface. A local microcontroller or microprocessor 408 may be coupled to the data detection circuit 500. The microprocessor 408 and the data detection circuit 500 may also be coupled to a host computer (not shown). The data detection circuit 500 may be coupled to the host computer through a portion of the host computer's ATA bus 412. The optical disc 402, pickup head 404, microcontroller 408, and host computer may be any of a wide variety of commercially available components. Though the data storage system 400 shown in the illustrative embodiment of FIG. 4 is coupled to a host computer, it will be recognized that a data storage system, such as for example, a DVD video player system, may be a stand-alone device and not require a host computer.

The data storage system 400 shown in FIG. 4 is just one example of a data storage system. Other data storage systems may also utilize the present invention, such as magnetic disk drive systems utilizing a read channel circuit a s a data detection circuit. Further, though shown separately, various components of the data storage system may be combined or additional components may be considered to be part of the system including components such as RAM, ROM, power supply circuits, servo circuitry, and other circuits. Moreover, certain features of the present invention are not limited to the use of data storage systems and may be utilized in many other electronic circuits.

Figure 5:
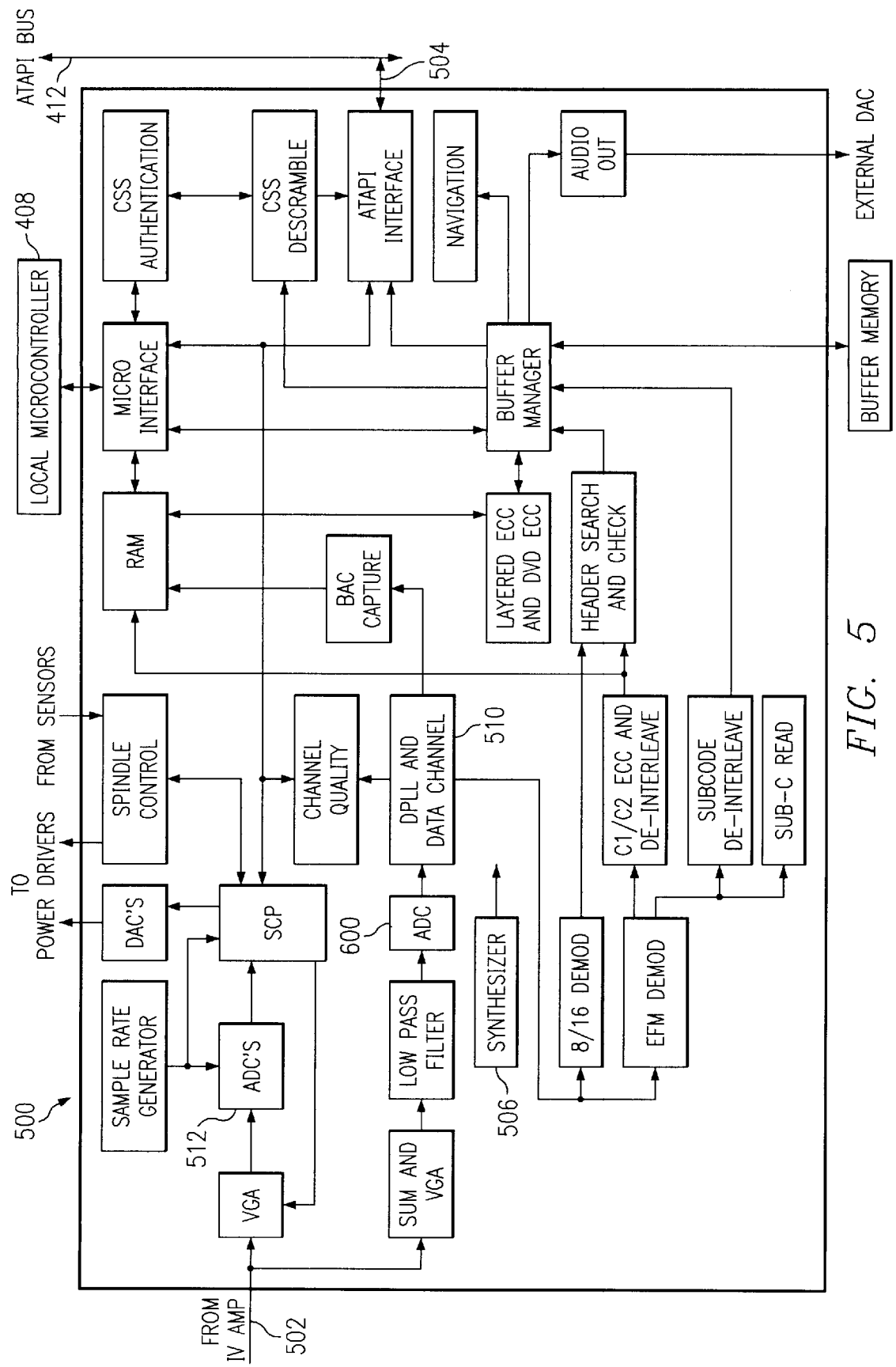
FIG. 5 is a block diagram of a data detection controller circuit for the optical storage system of FIG. 4.

FIG. 5 illustrates an exemplary embodiment of a data detection circuit 500. As shown in FIG. 5, the data detection circuit 500 may include a data input 502, which coupled to an optical pickup head, and include a data output 504, which may be coupled to the ATAPI bus 412. The data detection circuit 500 may also include a frequency synthesizer 506 to provide clock signals to the various circuit elements such as the read path ADC 600, data channel circuitry 510, the servo path, the servo path ADCs 512, and the other circuitry shown in FIG. 5 such as various data recovery circuits such as decimation filters, equalizer circuits, offset and gain control circuits, decoder circuits, digital PLL circuits, etc. Although FIGS. 4 and 5 illustrate an example data detection circuit 500 which has read operations only, the present invention may be utilized in a circuit that also includes write circuitry (i.e. a read/write data channel circuit). Thus, as used herein a data channel circuit may indicate a read channel only circuit or a circuit that includes read and write functions (read/write channel circuit) or additional functions It will also be recognized that the ADC's and techniques disclosed herein may be utilized with a wide range of circuits.

Figure 1:
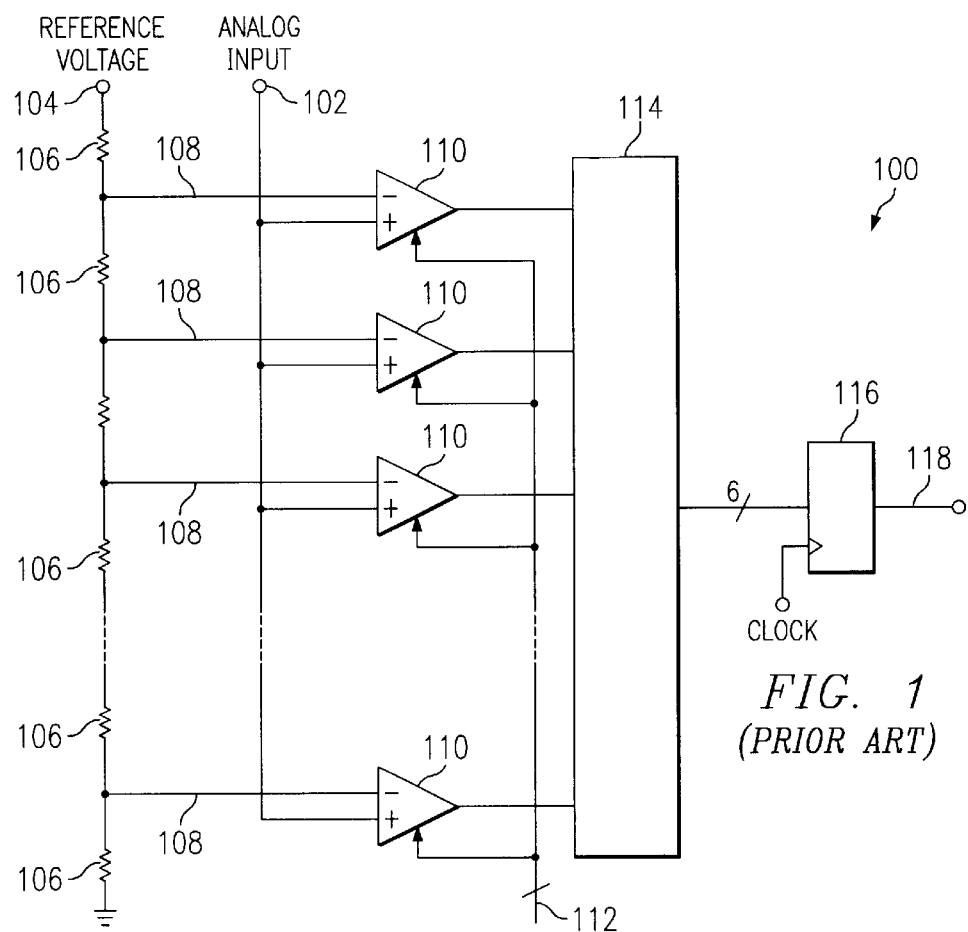
FIG. 1 is a block diagram of a prior art flash analog to digital converter (ADC).
Figure 2:
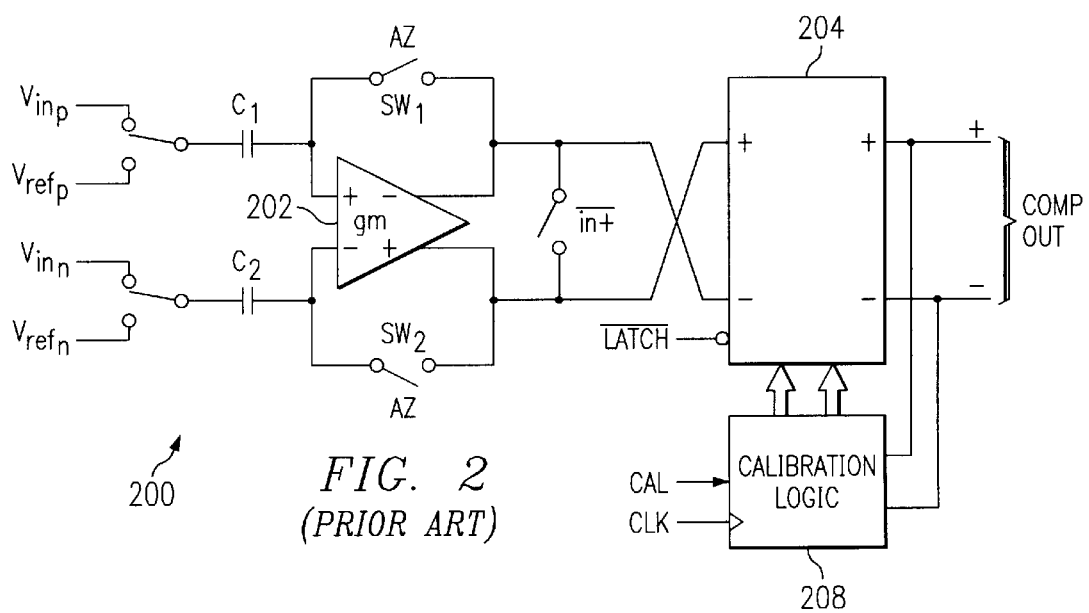
FIG. 2 illustrates a prior art circuit for implementing ADC calibrating and auto-zero techniques.
Figure 3A:
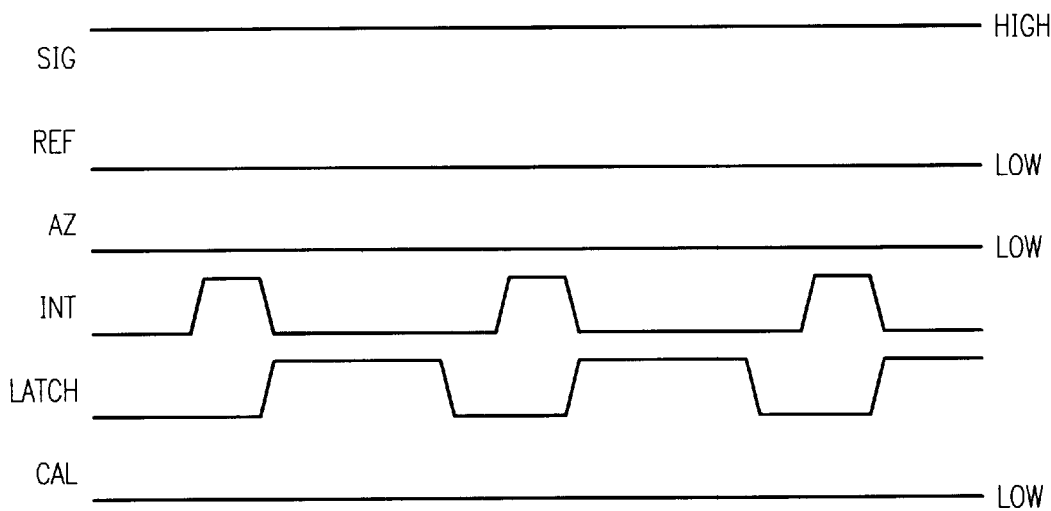
FIGS. 3A, 3B and 3C are timing sequences for the normal operation, calibration and auto-zero modes of an ADC.
Figure 3B:
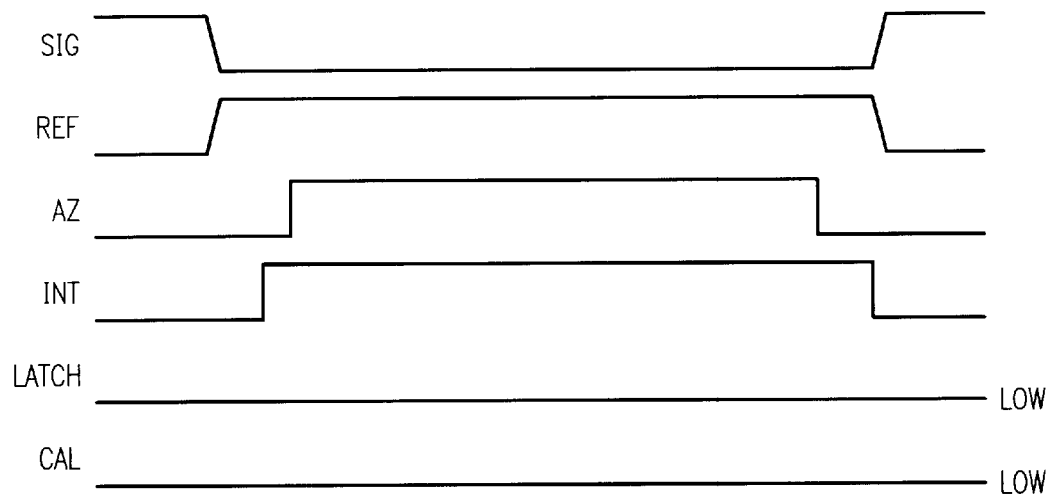
Figure 3C:
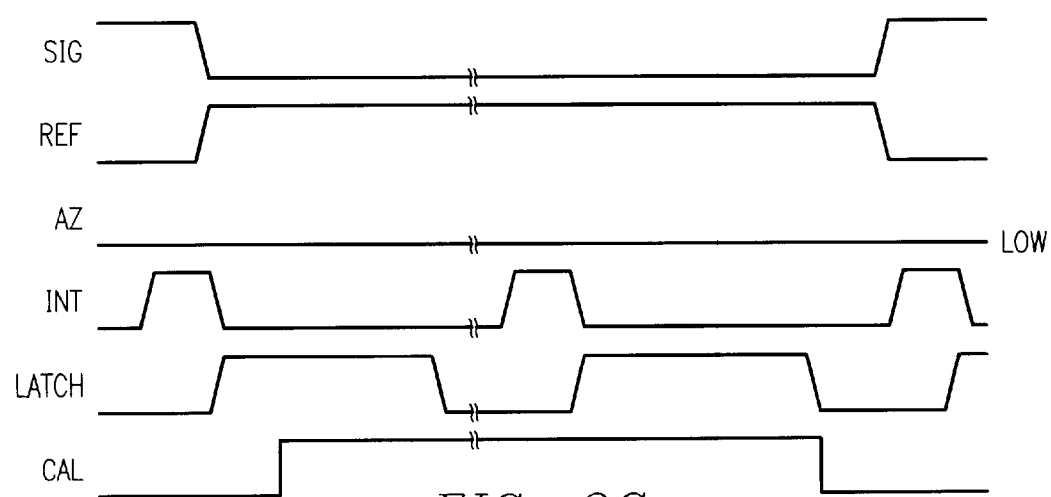

FIG. 6 is a block diagram of one embodiment of a flash analog to digital converter 600 of the present invention. The ADC 600 includes an analog input 602 and a reference voltage input 604. The reference voltage is divided into $2^n-1$ separate voltages (other than $Vref_1$ and $Vref_2$) through a series of resistors 606 which form a resistor voltage divider. For illustrative purposes, n=6 in the ADCs described herein; however, it will be appreciated that n can equal other integers. Output taps are provided from the resistor voltage divider to provide reference voltage inputs 608 to a series of $2^6-1=63$ comparators 610. The analog input 602 which is to be converted to a digital value is provided through another input to each of the comparators 610. For clarity in FIG. 6, certain control signals (which are shown in prior art FIG. 1) are not included. The output of each comparator 610 is a binary state (high or low) which indicates whether the analog input 602 is greater than or less than the particular reference voltage 608 that is input to the comparator 610. The outputs 612 of the comparators 610 are provided to digital encoding logic 614. By observing where the outputs of the comparators 610 change from one digital state to the other, the encoder 614 determines between which two reference voltages the analog input lies and provides an n=6-bit digital representation of a voltage that represents, for example, the lower or higher reference voltage or a midpoint voltage. The 6-bit representation may then be provided on an output line as the ADC output 618. The digital encoding logic 614 may also include bubble suppression logic.

In the embodiment illustrated in FIG. 6, with n=6, the comparators 610 are divided into two banks 620 and 622 comprising the odd $2^{n-1}=32$ comparators interleaved with the even $2^{n-1}-1=31$ comparators, respectively. Control lines 624 and 626 separately place the comparators of the first and second banks 620 and 622, respectively, in the calibrate mode and control lines 628 and 630 separately place the comparators of the first and second banks 620 and 622, respectively, in the auto-zero mode. Thus, one bank may be in the calibrate (or auto-zero) mode while the other bank continues to operate in the normal mode. Based upon the status of additional control lines 632 and 634, logic in the encoder 614 converts the thermometer code from the first bank 620 (if the second bank 622 is in the calibration or auto-zero mode). from the second bank 622 (if the first bank 620 is in the calibration or auto-zero mode), or from both banks 620 and 622 (if both are in the normal mode) into a 6-bit ADC output word 618.

Figure 7:
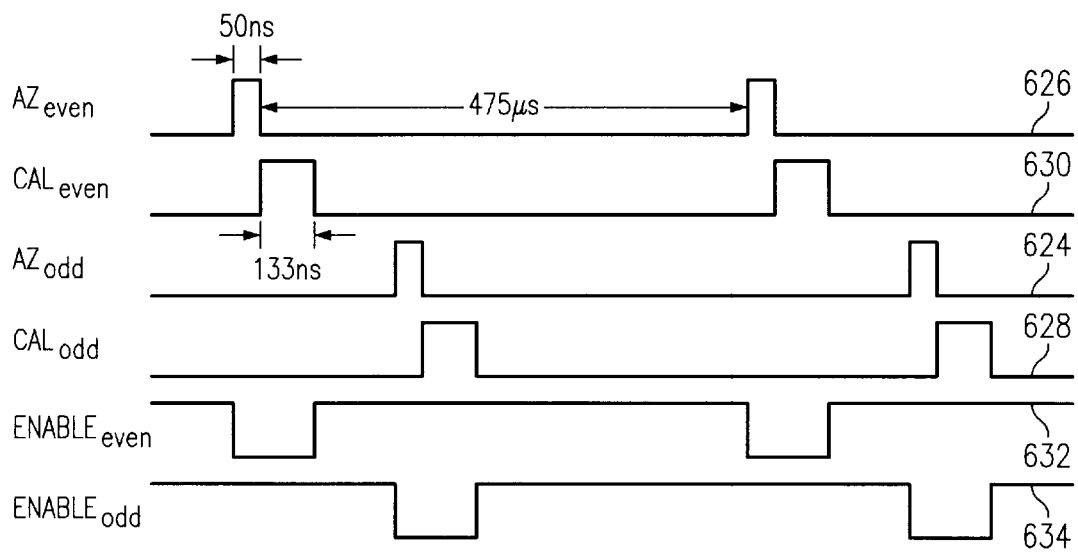
FIG. 7 illustrates the status of control lines during operation of the ADC of FIG. 6.
Figures 8A, 8B, 8C:
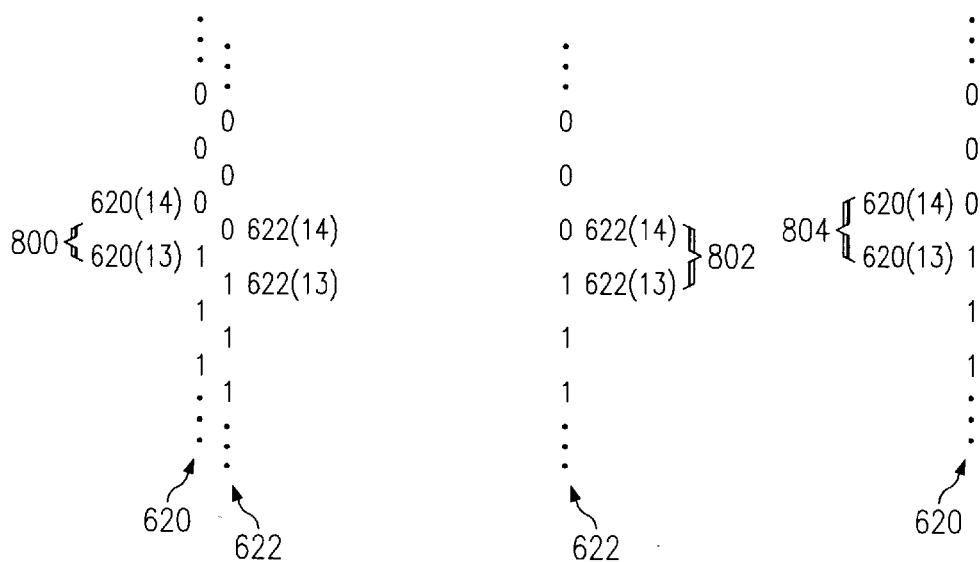
FIGS. 8A, 8B and 8C show exemplary thermometer code outputs of two comparator banks when the ADC of FIG. 6 is operated in the normal mode and the calibrate/auto-zero modes for both of the banks.

Referring now to FIG. 7, the operation of the embodiment of FIG. 6 will be described. In the normal operation mode, the control lines $CAL_{odd}$ 624, $CAL_{even}$ 626, $AZ_{odd}$ 628 and $AZ_{even}$ 630 are all in a low state; consequently, control lines $ENABLE_{even}$ 632 and $ENABLE_{odd}$ 634, through inverting OR gates 636 and 638, are in a high state (the choice of high and low states herein is arbitrary and for illustrative purposes only). The interleaved outputs from both comparator banks 620 and 622, in the form of bit thermometer code, are processed by the encoder 614 which generates the ADC output 618. For example, if the outputs of the first and second banks 620 and 622 are as represented in FIG. 8A, state transitions lie between the comparators 620(13) and 620(14) in the first bank 620 and between the comparators 622(13) and 622(14) in the second bank 622. With the ADC 600 operating in the normal mode, the encoder 614 processes the combined outputs from both banks 620 and 622 and determines that the state transition 800, between outputs 620(13) and 622(14), represents the closest approximation of the value of the analog input 602 (given the $1/64^{th}$ resolution of the ADC 600).

Periodically (such as every 475 μs) during the operation of the device in which the ADC 600 is incorporated (such as the optical drive 400), it becomes necessary to auto-zero and calibrate the comparators in the first and second banks 620 and 622. In FIG. 7, the control line $AZ_{even}$ 626 goes to a high state (it will be appreciated that the auto-zero process could alternatively begin with $AZ_{odd}$ going to a high state) and the comparators in the second bank 622 are auto-zeroed using known methods. Consequently, the control line $ENABLE_{even}$ 632 transitions to the low state, indicating to the encoder 614 to disregard the outputs from the second bank 622, effectively removing such outputs from the data conversion path. The encoder only processes the outputs from the first bank 620. As shown in FIG. 8B, the analog input 602 is represented by the transition 802 between the comparators 622(13) and 622(14) and the encoder 614 outputs the corresponding 6-bit ADC output 618. However, with the second bank 622 removed from the data conversion path, the resolution is now $1/32$, one-half of the resolution of the ADC when operated in the normal mode. After approximately 50 ns and 15 clock gates, auto-zero is complete and the control line $AZ_{even}$ goes low again. When the comparators of the second bank 622 are to be calibrated (shown in FIG. 7 as being immediately upon completion of their autozeroing), the ADC 600 enters the calibration mode: the control line $CAL_{even}$ 630 goes high and the control line $ENABLE_{even}$ 632 stays low (or goes low if there is an interval of time between calibration and auto-zero). The second bank 622 remains out of the data conversion path and the encoder 614 processes only the outputs from the first bank 622 to generate the ADC output 618. After approximately 50 ns, the control line $CAL_{even}$ 630 goes low causing the control line $ENABLE_{even}$ 632 to go high, signaling the completion of the calibration operation. Thereafter (either immediately or, preferably, approximately halfway between $AZ_{even}$ cycles), a corresponding process is performed to auto-zero and calibrate the first bank 620, beginning with the control line $AZ_{odd}$ 624 going high and the control line $ENABLE_{odd}$ 632 going low.

FIG. 9 is a block diagram of another embodiment of an analog to digital converter 900 of the present invention. The front end of the ADC 900 remains similar to the front end of the ADC 600 of the embodiment of FIG. 6. The ADC 900 includes an analog input 902 and a reference voltage input 904. The reference voltage 904 is divided into 2n–1 separate voltages (other than Vref1 and Vref2) through a series of resistors 906 which form a resistor voltage divider. While n=6 in the ADC described in FIG. 9, it will again be appreciated that n can equal other integers. Output taps are provided from the resistor voltage divider to provide reference voltage inputs 908 to a series of 26=64 comparators 910. The analog input 902 which is to be converted to a digital value is provided through the input to each of the comparators 910. For clarity in FIG. 9, certain control signals (which are shown in prior art FIG. 1) are not included. The output of each comparator 910 is a binary state (high or low) which indicates whether the analog input 902 is greater than or less than the particular reference voltage 908 that is input to the comparator 910. In FIG. 9, with n=6, the comparators 910 are divided into two banks 920 and 922 comprising the odd 2n–1=32 comparators interleaved with the even 2n–1–1=31 comparators, respectively. Control lines 924 and 926 separately place the comparators of the first and second banks 920 and 922, respectively, in the calibrate mode and control lines 928 and 930 separately place the comparators of the first and second banks 920 and 922, respectively, in the auto-zero mode. Thus, one bank may be in the calibrate (or auto-zero) mode while the other bank continues to operate in the normal mode.

The outputs of the first bank 920 are coupled to a first encoder 940 and the outputs of the second bank 922 are coupled to a second encoder 942. The encoders 940 and 942 convert the 2n–1–1(=31) bit thermometer code from the two banks 920 and 922 into two n–1 (=5) bit words 944 and 946, respectively. The encoders 940 and 942 may also include bubble suppression logic. Combinatory logic 948 is coupled to receive the two 5-bit words 944 and 946 and, based upon the status of control lines 932 and 934 (which are, in turn, the logical results of processing the control lines 926 and 930 through a first inverted OR gate 936 and control lines 924 and 928 through a second inverted OR gate 938), generates an appropriate n (=6) bit ADC output 918.

FIG. 10 illustrates an embodiment of the combinatory logic 948 which may be used to generate the ADC output 918 from the two n-bit words 944 and 946 produced by the encoders 940 and 942. When both banks 920 and 922 are enabled and in the normal operation mode (that is, when both of the control lines 932 and 934 are active), the least significant bit BANKodd(0) of the output from the first encoder 940 is XNOR'ed with the least significant bit BANKeven(0) of the output from the second encoder 942. (The logical XNOR function may also be known as the "coincidence" or "XAND" function in which the output is a logical 1 only if all of the inputs are the same; otherwise the output is a logical 0.) The resulting bit is appended (represented in FIG. 10 by the symbol '&') to the output BANKeven 946 from the second encoder 942, resulting in an n-bit word. It will be understood that one method to accomplish such an append may be to multiply by two the output BANKeven 946 and then add the one bit result of the XNOR operation, as illustrated in FIG. 11. When the second bank 922 is in the calibrate or auto-zero mode (that is, when the control line 934 is inactive), a zero may be appended to the output BANKodd 944 from the first encoder 940 resulting in an n-bit word. Similarly, when the first bank 920 is being calibrated or auto-zeroed (that is, when the control line 932 is inactive), a zero may be appended to the output BANKeven 946 from the second encoder 942 resulting in an n-bit word. Based upon the status of the control lines 932 and 934, a multiplexer 950 selects the appropriate 6-bit word and outputs it as the ADC output 918. If both control lines 932 and 934 are low, an error is indicated and '000000' will be output.

It has been found that there may be an offset of –½ lsb when one of the banks of comparators is removed from the data conversion path. The graphs of FIGS. 12A and 12B illustrate such offset. A first transfer function 1200 (FIG. 12A) is a plot of the voltage in (volts/lsb step) vs the least significant bit of the ADC output when both banks of comparators are in the data conversion path. A second transfer function 1202 (FIG. 12B) is a plot of the voltage in (volts/lsb step) vs the least significant bit of the ADC output when the odd bank of comparators has been removed from the data conversion path. A third transfer function 1204 (FIG. 12B) is a plot of the voltage in (volts/lsb step) vs the least significant bit of the ADC output when the even bank of comparators has been removed from the data conversion path. The effect of the offset can be removed, thereby increasing the accuracy of the ADC of the present invention, by passing an extra ($7^{th}$) bit with the ADC output and setting the extra bit to 1 when the first or second bank is removed from the data conversion path. Alternatively, the least significant bit of the ADC output may be randomly toggled when the first or second bank is removed from the data conversion path.

FIG. 13 is a block diagram of still another embodiment of an analog to digital converter 1300 of the present invention. The converter 1300 includes much of the converter illustrated in FIG. 9 (labeled 900A in FIG. 13) with an additional module 1310 to receive the n−1 bit outputs from the encoders 940 and 942. The module 1310 may be a filter to hold and average such outputs. In operation, when one bank of $2^{n-1}$ comparators is removed from the data path for calibration, the outputs from the encoder associated with the remaining bank of $2^{n-1}$ comparators may be processed into the module 1310 at four times the usual clocking rate and output at the usual rate ("oversampled"), thereby regaining the bit which was "lost" by the removal of one bank and generating an output 1320 having a full n-bits. Alternatively, some resolution, but less than a full bit, may be regained by processing the data at twice the usual rate Utilizing two banks of comparators in an ADC, taking one bank offline for calibration while the ADC continues to operate with the remaining bank, then taking the other bank offline for calibration while the ADC continues to operate with the first bank, tends to simplify the design and implementation of the ADC (relative to prior art designs in which any one of all $2^n$ comparators may be removed from the data path for calibration) as it requires fewer lines to be routed and requires less complicated and physically smaller digital control circuitry.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method of operating a flash analog to digital converter (ADC) having an n-bit ADC output, comprising the steps of:

performing analog to digital conversions by utilizing a first bank of 2n−1−1 comparators and a second bank of 2n−1 comparators, the comparators of the first bank being interleaved with the comparators of the second bank;

removing the first bank from a data conversion path within the analog to digital converter;

calibrating the comparators of the first bank while the first bank is removed from the data conversion path; and employing the second bank to continue to perform analog to digital conversions while the first bank is removed from the data conversion path.

2. The method of claim 1, further comprising the steps of:

restoring the first bank to the data conversion path;

removing the second bank from the data conversion path;

calibrating the comparators of the second bank while the second bank is removed from the data conversion path;

employing the first bank to continue to perform analog to digital conversions while the second bank is removed from the data conversion path; and restoring the second bank to the data conversion path.

3. The method of claim 2, wherein said steps of performing and continuing to perform analog to digital conversions comprise the steps of:

receiving in an encoder thermometer code output from the first and second banks; and generating the n-bit ADC output in the encoder from the thermometer code.

4. The method of claim 3, wherein said generating step comprises the steps of:

when both the first and second banks are in the data conversion path, converting the thermometer code output from the first and second banks into the n-bit ADC output having a resolution of x;

when the first bank is removed from the data conversion path, converting the thermometer code output from the second bank into the n-bit ADC output having a resolution of ½x; and when the second bank is removed from the data conversion path, converting the thermometer code output from the first bank into the n-bit ADC output having a resolution of ½x.

5. The method of claim 3, wherein said generating step includes the step of applying bubble suppression to the thermometer code from the first and second banks.

6. The method of claim 2, wherein said steps of performing and continuing to perform analog to digital conversions comprise the steps of:

receiving in a first encoder $2^{n-1}$ outputs of the first bank and generating a first n−1 bit word;

receiving in a second encoder $2^{n-1}$ outputs of the second bank and generating a second n−1 bit word;

if the second bank is removed from the data conversion path, appending a zero to the first n−1 bit word to produce the n-bit ADC output;

if the first bank is removed from the data conversion path, appending a zero to the second n−1 bit word to produce the n-bit ADC output; and if neither the first nor the second banks are removed from the data conversion path:

XNORing the least significant bit of the first n−1 bit word with the least significant bit of the second n−1 bit word to generate an intermediate one-bit word; and appending the intermediate one-bit word to the second n−1 bit word to produce the n-bit ADC output.

7. The method of claim 6, further comprising the steps of applying bubble suppression to the outputs of the first and second banks.

8. The method of claim 2, further comprising the step of auto-zeroing the comparators of the first bank and the second bank while each bank is respectively removed from the data conversion path.

9. A flash analog to digital converter (ADC) having an n-bit ADC output, comprising:
- a first bank of $2^{n-1}-1$ comparators, each comparator having a first input coupled to an analog data source and a second input coupled to one of a first plurality of reference voltages;
- a second bank of $2^{n-1}$ comparators, each comparator having a first input coupled to the analog data source and a second input coupled to one of a second plurality of reference voltages, the comparators of said second bank being interleaved with the comparators of said first bank and the second plurality of reference voltages being interleaved with the first plurality of reference voltages;
- switching circuitry to separately remove and restore said first and second banks from and to a data conversion path within the analog to digital converter;
- calibration circuitry to calibrate said first bank and said second bank while each is separately removed from the data conversion path; and
- an encoder for encoding outputs from said first and second banks into an n-bit ADC output.

10. The analog to digital converter of claim 9, wherein:
- when said first and second banks are both in the data conversion path, said encoder encodes thermometer code output from said first and second banks into the ADC output with a resolution of x;
- when said first bank is removed from the data conversion path, said encoder encodes the thermometer code output from said second bank into the ADC output with a resolution of ½x; and
- when said second bank is removed from the data conversion path, said encoder encodes the thermometer code output from said first bank into the ADC output with a resolution of ½x.

11. The analog to digital converter of claim 9, said encoder comprising:
- a first encoder for encoding the outputs of said first bank into a first n−1 bit word;
- a second encoder for encoding the outputs of said second bank into a second n−1 bit word;
- a combinatory logic circuit to generate the n-bit ADC output whereby:
  - when said first bank is removed from the data conversion path, a zero is appended to the second n−1 bit word to produce the ADC output;
  - when said second bank is removed from the data conversion path, a zero is appended to the first n−1 bit word to produce the ADC output; and
  - when both said first and second banks are in the data conversion path:
    - the least significant bits of the first and second n−1 bit words are XNORed to generate an intermediate one-bit word; and
    - the one-bit word is appended to the n−1 bit word to produce the n-bit ADC output.

12. The analog to digital converter of claim 11, wherein said first encoder and said second encoder each include a bubble suppression logic circuit.

13. The analog to digital converter of claim 11, wherein:
- when said first and second banks are both in the data conversion path, the ADC output has a resolution of x; and
- when either said first bank or said second bank is removed from the data conversion path, the ADC output has a resolution of ½x.

14. The analog to digital converter of claim 9, further comprising:
- a first encoder for encoding the outputs of said first bank into a first n−1 bit word;
- a second encoder for encoding the outputs of said second bank into a second n−1 bit word; and
- a module enabled when only one of the first bank or the second bank is in the data conversion path to oversample and average the output of the bank in the data conversion path, thereby generating an additional bit of resolution and subsequently generate the n-bit ADC output.

15. The analog to digital converter of claim 9, further comprising auto-zero circuitry to auto-zero said first and second banks while said first and second banks are separately removed from the data conversion path.

16. A data detector system for a data storage device, comprising:
- a data input coupled to receive a data stream from a data storage medium; and
- an n-bit analog to digital converter coupled to said data input, comprising:
  - at least one reference voltage;
  - a first bank comprising $2^{n-1}-1$ comparators, each comparator having a first input coupled to said data input and a second input coupled to said at least one reference voltage;
  - a second bank comprising $2^{n-1}$ comparators, each comparator having a first input coupled to said data input and a second input coupled to said at least one reference voltage, the comparators of said second bank being interleaved with the comparators of said first bank;
  - switching circuitry to separately remove and restore said first and second banks from and to a data conversion path within said analog to digital converter;
  - calibration circuitry to calibrate said first bank and said second bank while each is separately removed from the data conversion path; and
  - an encoder for encoding outputs from said first and second banks into an n-bit ADC output.

17. The data detector system of claim 16, wherein:
- when said first and second banks are both in the data conversion path, said encoder encodes thermometer code output from said first and second banks into the ADC output with a resolution of x;
- when said first bank is removed from the data conversion path, said encoder encodes the thermometer code output from said second bank into the ADC output with a resolution of ½x; and
- when said second bank is removed from the data conversion path, said encoder encodes the thermometer code output from said first bank into the ADC output with a resolution of ½x.

18. The data detector system of claim 16, said encoder comprising:
- a first encoder for encoding the outputs of said first bank into a first n−1 bit word;
- a second encoder for encoding the outputs of said second bank into a second n−1 bit word;
- a combinatory logic circuit to generate the n-bit ADC output whereby:

when said first bank is removed from the data conversion path, a zero is appended to the second n−1 bit word to produce the ADC output;

when said second bank is removed from the data conversion path, a zero is appended to the first n−1 bit word to produce the ADC output; and when both said first and second banks are in the data conversion path:

the least significant bits of the first and second n−1 bit words are XNORed to generate an intermediate one-bit word; and the one-bit word is appended to the n−1 bit word to produce the n-bit ADC output.

19. The data detector system of claim 16, said analog to digital converter further comprising auto-zero circuitry to auto-zero said first and second banks while said first and second banks are separately removed from the data conversion path.

20. The data detector system of claim 16, the data storage medium being an optical disc.

21. An data storage system, comprising:

a read head to detect data stored on a data storage medium within the data storage system;

a data input coupled to receive an analog data stream from said read head; and an n-bit analog to digital converter coupled to said data input, comprising:

at least one reference voltage;

a first bank comprising $2^{n-1}-1$ comparators, each comparator having a first input coupled to said data input and a second input coupled to said at least one reference voltage;

a second bank comprising $2^{n-1}$ comparators, each comparator having a first input coupled to said data input and a second input coupled to said at least one reference voltage, the comparators of said second bank being interleaved with the comparators of said first bank;

switching circuitry to separately remove and restore said first and second banks from and to a data conversion path within said analog to digital converter;

calibration circuitry to calibrate said first bank and said second bank while each is separately removed from the data conversion path; and an encoder for encoding outputs from said first and second banks into an n-bit ADC output.

22. The data storage system of claim 21, wherein:

when said first and second banks are both in the data conversion path, said encoder encodes thermometer code output from said first and second banks into the ADC output with a resolution of x;

when said first bank is removed from the data conversion path, said encoder encodes the thermometer code output from said second bank into the ADC output with a resolution of ½x; and when said second bank is removed from the data conversion path, said encoder encodes the thermometer code output from said first bank into the ADC output with a resolution of ½x.

23. The data storage system of claim 21, said encoder comprising:

a first encoder for encoding the outputs of said first bank into a first n−1 bit word;

a second encoder for encoding the outputs of said second bank into a second n−1 bit word;

a combinatory logic circuit to generate the n-bit ADC output whereby:

when said first bank is removed from the data conversion path, a zero is appended to the second n−1 bit word to produce the ADC output;

when said second bank is removed from the data conversion path, a zero is appended to the first n−1 bit word to produce the ADC output; and when both said first and second banks are in the data conversion path:

the least significant bits of the first and second n−1 bit words are XNORed to generate an intermediate one-bit word; and the one-bit word is appended to the n−1 bit word to produce the n-bit ADC output.

24. The data storage system of claim 21, said analog to digital converter further comprising auto-zero circuitry to auto-zero said first and second banks while said first and second banks are separately removed from the data conversion path.

25. The data detector system of claim 21, the data storage medium being a removable optical disc.

* * * * *

UNITED STATES PATENT AND TRADEMARK OFFICE
CERTIFICATE OF CORRECTION

PATENT NO. : 6,459,394 B1
DATED : October 1, 2002
INVENTOR(S) : Nadi et al.

It is certified that error appears in the above-identified patent and that said Letters Patent is hereby corrected as shown below:

Column 2,
Line 1, please delete "$2_n$" and insert -- $2^n$ --.

Column 4,
Line 28, please delete "$2^{n-1}$ 1" and insert -- $2^{n-1}$ --.

Column 7,
Line 61, please delete "2n-1" and insert -- $2^{n-1}$ --.
Line 67, please delete "26=64" and insert -- $2^n=64$ --.

Column 8,
Line 10, please delete "2n-1=32" and insert -- $2^{n-1}=32$ --.
Line 11, please delete "2n-1-1=31" and insert -- $2^{n-1}-1=31$ --.
Line 22, please delete "2n-1-1(=31)" and insert -- $2^{n-1}-1=31$ --.

Column 9,
Line 62, please delete "2n-1-1" and insert --$2^{n-1}-1$ --.
Line 63, please delete "2n-1" and insert -- $2^{n-1}$ --.

Signed and Sealed this

Twenty-eighth Day of January, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,459,394 B1
DATED : October 1, 2002
INVENTOR(S) : Itani et al.

It is certified that error appears in the above-identified patent and that said Letters Patent is hereby corrected as shown below:

<u>Title page,</u>
Item [12], please delete "Nadi et al." and insert -- Itani et al. --.
Item [75], please delete "Itani R. Nadi" and insert -- Nadi R. Itani --.

Signed and Sealed this

First Day of April, 2003

JAMES E. ROGAN
*Director of the United States Patent and Trademark Office*